United States Patent [19]

Sasa et al.

[11] Patent Number: 4,591,544
[45] Date of Patent: May 27, 1986

[54] METAL IMAGE FORMING MATERIALS WITH LIGHT SENSITIVE RESIN LAYER AND OBLIQUE ANGLE DEPOSITED METAL UNDERLAYER

[75] Inventors: Nobumasa Sasa, Hino; Yuzuru Sato, Hachioji; Tatsuo Ohta, Sagamihara; Masanari Shindo, Hachioji, all of Japan

[73] Assignee: Konishiroku Photo Industry Co., Ltd., Tokyo, Japan

[21] Appl. No.: 688,743

[22] Filed: Jan. 2, 1985

Related U.S. Application Data

[63] Continuation of Ser. No. 436,644, Oct. 25, 1982, abandoned.

[30] Foreign Application Priority Data

| Nov. 2, 1981 | [JP] | Japan | 56-174417 |
| Nov. 2, 1981 | [JP] | Japan | 56-174418 |
| Nov. 2, 1981 | [JP] | Japan | 56-174419 |
| Nov. 4, 1981 | [JP] | Japan | 56-175800 |

[51] Int. Cl.$^4$ .................. C23C 16/44; G03C 1/74; G03C 1/94; G03F 7/16
[52] U.S. Cl. .................. 430/166; 430/189; 430/275; 430/276; 430/278; 430/324; 430/327; 430/495; 430/496; 430/935; 427/250
[58] Field of Search ............ 430/189, 275, 276, 278, 430/166, 324, 327, 935, 495, 496; 427/250

[56] References Cited

U.S. PATENT DOCUMENTS

| 4,006,268 | 2/1977 | Kennedy et al. | 427/250 |
| 4,008,084 | 2/1977 | Ikeda et al. | 430/276 |
| 4,129,166 | 12/1978 | Sigsbee | 427/250 |
| 4,205,989 | 6/1980 | Moriya et al. | 430/278 |
| 4,210,712 | 7/1980 | Munger et al. | 430/278 |
| 4,218,532 | 8/1980 | Dunkleberger | 430/327 |
| 4,271,257 | 6/1981 | Wacks et al. | 430/276 |
| 4,278,710 | 7/1981 | Jelks | 427/250 |
| 4,309,810 | 1/1982 | Drake | 427/250 |
| 4,379,827 | 4/1983 | Hallman | 430/276 |
| 4,405,658 | 9/1983 | Young | 427/250 |
| 4,405,710 | 9/1983 | Balasubramanyan | 430/296 |
| 4,409,262 | 10/1983 | Jelks et al. | 427/250 |
| 4,526,858 | 7/1982 | Lukens et al. | 430/296 |
| 4,529,686 | 7/1985 | Kraus | 430/324 |

OTHER PUBLICATIONS

Hu, Evelyn et al., "High Resolution . . . Junctions", *IEEE Transactions on Electron Devices*, vol. Ed-28, No. 11, pp. 1382-1385, 11/1981.
Speidell, J. C., "Simple Method . . . Lines", J. Vac. Sci., Tech., vol. 19, No. 3, 9-10/1981, pp. 693-695.

*Primary Examiner*—Charles L. Bowers, Jr.
*Attorney, Agent, or Firm*—Jordan B. Bierman

[57] ABSTRACT

A metal image forming material in which the thin metal layer can be etched in short period to provide a sharp image without a strong etchant is disclosed. Said metal image forming material comprises a support, at least one metal layer and an overlying light sensitive layer. Said metal layer is formed by vapor-depositing a metal on the support at an angle with respect to the surface of the support.

30 Claims, 5 Drawing Figures

METAL IMAGE FORMING MATERIALS WITH LIGHT SENSITIVE RESIN LAYER AND OBLIQUE ANGLE DEPOSITED METAL UNDERLAYER

This Application is a continuation of Ser. No. 436,644, filed Oct. 25, 1982, abandoned which claims priority of Japanese Applications 174,417/1981, 174,418/1981, and 174,419/1981, all filed Nov. 2, 1981, and Japanese Application 175,800/1981, filed Nov. 4, 1981.

FIELD OF THE INVENTION

The present invention relates to materials for forming photographic metal images.

BACKGROUND OF THE INVENTION

Metal image forming materials comprising an image forming layer such as a light-sensitive resin layer and a metal layer made on a metal or non-metal support are conventionally used in photofabrication or photoetching wherein an etching mask is formed in a predetermined pattern on the metal layer by photographic techniques, and the non-image area of the metal is etched chemically or electrochemically to provide the desired metal image or bore a hole or make a groove. When a thin metal film is used as the image forming layer, the etching mask or resist on the image area of the resin layer has a tendency to be attacked by the etchant, and if the etchant is not so strong as to attack the resist, the thin metal film cannot be effectively etched in a short period. A strong etchant is a potential hazard and pollutant and requires the use of a very powerful resist. A strong etchant or weak resist fails to produce a sharp image because, as the etching proceeds, the etchant penetrates not only vertically but also transversely to cause the undesired effect of a blurred image generally referred to as "side etch". Another problem with the conventional metal image forming material is the low fidelity of a reproduced image because light from a UV lamp or the like is transmitted through the light-sensitive resin layer and is reflected from the underlying thin metal layer to cause halation.

SUMMARY OF THE INVENTION

Therefore, an object of the present invention is to provide a metal image forming material in which the thin metal layer can be etched in a short period to provide a sharp image without using a strong etchant. This object can be achieved by a metal image forming material comprising a support, at least one metal layer and an overlying light-sensitive layer, said metal layer being formed by vapor-depositing a metal on the substrate at an angle with respect to the surface of the support.

The support may be coated with a subbing layer that is soluble in or has affinity for an aqueous processing solution. The angle $\theta$ of deposition is defined as the angle between the entrance direction of the particles to be deposited and the normal to the support, and it is preferably 30 degrees or more, particularly preferably 45 degrees or more. The entrance direction of the vaporized metal particles to be deposited over the support is defined as follows:

A flat transparent substrate on both surfaces of which the vaporized metal particles deposit is exposed to the vaporized metal for a predetermined time, and the angle formed between the surface of the substrate and the normal to the support at the time the amount of metal deposited on said substrate is the least is referred to as the entrance direction.

The metal vapor may be deposited on the support at an increasing angle $\theta$ of deposition. Alternatively, two metal layers may be formed by depositing the vapor of a metal at an angle of $\theta_1$ and then depositing the vapor of the same or different metal at an angle of $\theta_2$ which is greater than $\theta_1$.

DESCRIPTION OF THE PREFERRED EMBODIMENTS

Figure 1:
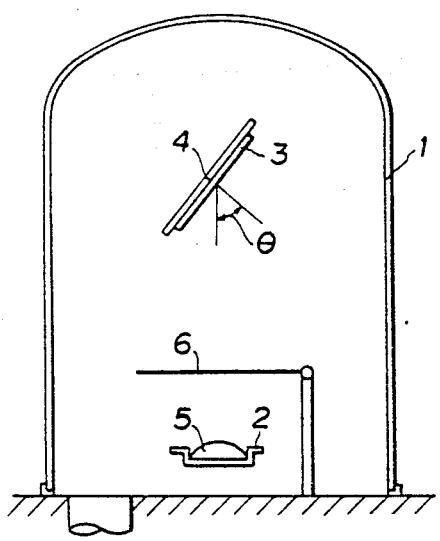
FIG. 1 is a schematic representation of an apparatus for producing the metal image forming material of the present invention according to one embodiment wherein a metal layer is vapor-deposited on the support at an angle of $\theta$.

The first step of producing the metal image forming material of the present invention is to form a metal layer on the surface of a cleaned support by vacuum deposition, sputtering, ion plating or the like, and the following description refers to vacuum deposition. FIG. 1 shows a bell jar 1 which includes a vaporization vessel 2 facing a support 3 that is held by a fixed substrate holder 4 inclined to provide an angle of deposition $\theta$. The vessel 2 is heated by a suitable method such as resistance heating or heating with electron beams to cause the vapor particles of a sample 5 to fly toward the support 3. The deposition duration can be controlled by opening and closing a shutter 6 provided between the vaporization vessel 2 and the substrate holder 4.

The thin metal layer of the metal image forming material of the present invention is made by vapor deposition from various metals such as aluminum-containing metals of the type described in Japanese patent application (OPI) No. 139720/75 (the symbol OPI as used herein means an unexamined published Japanese patent application), as well as tellurium, molybdenum, polonium, cobalt, zinc, copper, nickel, iron, tin, vanadium, germanium, silver, chromium, titanium and their alloys, as described in Japanese patent applications (OPI) Nos. 65927/73, 65928/73, 2925/75 and 14161/75. A thin aluminum layer is preferred.

The angle $\theta$ of deposition is preferably at least 30 degrees, more preferably at least 45 degrees. In the embodiment of FIG. 1, the metal vapor produced by resistance heating is vacuum-deposited, but other methods can be used to form the desired deposited metal layer by heating with electron beams, sputtering or ion plating.

The thickness of the metal layer depends on the optical density necessary for the resulting image. The thickness of the metal layer is virtually proportional to the optical density although some variation may exist depending on the method for vapor deposition (e.g. conditions of vacuum deposition). Line images or halftone images generally require high densities, say, at least 2.0, and higher densities, say, at least 3.0, are required if the metal image forming material of the present invention is used as a mask for printing on PS plates. The optical density is measured with a Macbeth transmission densitometer. Forming a metal layer thicker than is necessary to provide the desired optical density is not precluded, but this is not recommended because it wastes the vapor source and prolongs the etching period necessary for forming the desired image and the prolonged etching may deteriorate the resist. The preferred thickness is from 100 Å to 3,000 Å, and in some uses, 400 Å to 1,500 Å is more preferred.

In the embodiment of FIG. 1, one metal layer is vapor-deposited on the support. If two or more metal layers are formed, at least the top layer may be formed by depositing the metal vapor at an angle with respect to the support. The metal layer of the present invention may be a mixture of the metal and a vapor-depositable organic material.

The support on which the metal layer is vapor deposited may assume various forms depending upon the specific use of the metal image forming material. Therefore, as in the conventional products, supports in the form of a sheet, film or plate may be used with advantage, and they may be transparent, translucent or opaque. The support should not be attacked by the etchant and the metal layer should not become loose from the support when the etchant is applied. The material of the support may be selected from known materials such as ceramics, amorphous glass, crystalline glass, metals, alloys, plastics and composite materials containing them. These materials may be transparent or opaque. If necessary, transparent materials may be made translucent or opaque by adding pigments or opacifying agents. The most frequently used metal image forming materials are those of transmission type wherein an imagewise pattern is formed on the metal layer and light is transmitted only through the non-image area where the support shows on the surface, and to make such image forming materials, transparent materials must be selected. If the product is of a reflection type wherein the image is viewed with reflected light, the support need not be transparent. The surface of the support may be pretreated by corona discharge or plasma treatment to provide an improved adhesion between the support and the metal layer.

Subsequently, a light-sensitive resin layer is formed on the metal layer from a coating solution. The coating solution is prepared by dissolving or dispersing one or more light-sensitive resins in a suitable medium containing necessary sensitizers and other addenda. The so prepared coating solution is applied to the metal layer by a known coating method such as roller coating, air-knife coating, dip coating, curtain coating or spray coating, and dried. The dry thickness of the resin layer may range from 0.1 to 10 microns. If the layer is thinner than 0.1 microns, it is too weak to be used as a resist, and if the thickness exceeds 10 microns, the etching period is prolonged and a resist image in exact correspondence to the exposed image may not be formed. The resulting metal image forming layer is processed by the following procedure: the light-sensitive resin layer is subjected to imagewise exposure by a known technique; the image forming layer is then treated with a solution working as a developer and etchant to develop the resin layer and etch the metal layer (by one-bath or two-bath method) at the same time, or the resin layer is developed with a developer and the metal layer etched with an etchant, and if desired, the resist (resin layer) is removed to thereby produce the desired metal image.

The light-sensitive resin layer of the present invention can be formed of any of the known resist-forming light-sensitive resins which include all monomers, prepolymers and polymers that upon illumination with near UV or visible rays have their molecular structures changed chemically in a short period with the attendant change in their physical properties such as solubility in solvents or viscosity. It is common sense in the art that monomers and prepolymers having these characteristics are included in the definition of "light-sensitive resins". Light-sensitive resins are classified into two types, soluble and peelable, by the method of their development, and each type is sub-divided into positive working and negative working types. Alternatively, light-sensitive resins are classified into the following three groups by the chemical reaction involved: those which upon exposure to radiation are crosslinked through metal ions or dimerized, those which contain certain materials that are decomposed upon exposure to radiation to initiate crosslinking, and those which enter into polymerization upon exposure to radiation. All of these resins are used in preparing the metal image forming material of the present invention. Known light-sensitive resins as well as those which will become available in the future may be used in the metal forming material of the present invention.

For practical purposes, the light-sensitive resins are preferably classified by the method of development rather than the chemical reaction involved. Positive-working type light-sensitive resins which form a solvent-soluble layer are decomposed upon exposure to light to form a 5-membered ring compound such as o-quinone diazide having a carboxyl group and the exposed area of the resin layer is removed by development with an alkali solution to leave the image behind on the unexposed area. Negative-working type light-sensitive resins include photocrosslinkable groups such as cynnamoyl groups or diazonium groups which form a network structure upon exposure to light and photopolymerizable monomers such as acrylamide and acrylic esters which increase their molecular weight upon exposure to light, and the unexposed part of the resin layer is removed by a suitable developer to leave the remaining insolubilized exposed part to form the desired image area. These solvent-soluble type light-sensitive resins are commonly employed in sensitive solutions for PS plates, wipe-on plates and photoetching resists.

Positive working type light-sensitive resins include 1,2-naphthoquinone diazides, and o-naphthoquinone azides may be combined with novolak resins to form, for example, 2,3,4-trioxybenzophenone-bis-(naphthoquinone-1,2-diazide-5,5-sulfonate ester), 2-(naphthoquinone-1,2-diazido-5-sulfonyloxy)-hydroxy-7-naphthalene, naphthoquinone-1,2-diazido-5-sulfanilide, and naphthoquinone-1,2-diazido-5-sulfonic acid novolak esters. Commercial products include KPR (type 3) of Eastman Kodak Company, U.S.A.; AZ-340, AZ-1350, AZ-111 and AZ-119 of Azoplate-shipley Company; Coping Lacquer-P of Kalle Aktingesellschaft; Photozol, Photozol B and Photozol E of Tokyo Ohka Kogyo Co., Ltd.; FPPR-300, FPPR-700 and FPPR-1000 of Fuji Chemical Industries Co., Ltd.

Commercial aqueous sensitive solutions containing negative working type resins are available from Okamoto Kagaku Kogyo K.K., Fuji Chemical Industries Co., Ltd. and Yotsuwa Sangyo K.K., and most of them are of the PVA-ammonium bichromate system, some being of glueammonium bichromate and casein-ammonium bichromate systems. Other useful negative working type light-sensitive resins include diazonium salts, azide compounds and cynnamoyl-containing compounds. Specific examples of the negative working type resins are those wherein diazo resins are combined with water-soluble or alkali-soluble resins, such as water-soluble diazo resins produced by condensing aromatic diazonium salts and active carbonyl-containing compounds, particularly aldehydes, say formaldehyde, in an acidic medium, for instance, condensation products of p-diazodiphenylamine and paraformaldehyde, and 1-diazo-4-dimethylaminobenzene-hydrofluoroborate, 1-diazo-3-methyl-4-dimethylaniline sulfate and 1-diazo-3-monoethylnaphthylamine as described in U.S. Pat. No. 1,762,033. The anion component of these water-soluble diazo resins may be substituted by $BF_4^-$, $PF_6^-$, $SiF_6^{--}$, $SbF_6^{--}$, $BeF_4^{--}$, $IO_4^-$ or organic sulfonic acid salts to provide oil-soluble diazo resins and they may also be used as soluble negative working light-sensitive resins. Other examples are water-soluble resins such as gelatin, polyvinyl alcohol, partially saponified polyvinyl acetate, methyl cellulose, hydroxyethyl cellulose, hydroxypropylmethyl cellulose, carboxymethyl cellulose, polyethylene glycol, and polyvinyl pyrrolidone; and alkali-soluble resins such as copolymers of styrene, methyl methacrylate, 2-hydroxyethyl methacrylate or glycidyl methacrylate and acrylic acid or methacrylic acid. Other negative working type resins include azide compounds such as those described in U.S. Pat. Nos. 2,852,379 and 2,940,853, e.g. p-phenylene bisazide, p-azidobenzophenone, 4,4'-diazidobenzophenone, 4,4'-diazidodiphenyl methane, 4,4'-diazidostilbene-4,4'-diazidochalcone, 2,6-di-(4'-azidobenzal)cyclohexanone and 2,6-di-(4'-azidobenzal)-4-methylcyclohexanone. These azide compounds are usually mixed in rubber solutions and available as "photosensitive rubber solutions". Natural as well as synthetic rubber may be used, and the polyisoprene described in Japanese Patent Publication No. 22084/70 is often used as synthetic rubber. Examples of the polymer having an azido group in the molecule are poly(vinyl azidobenzoate), poly(vinyl azidophthalate), polyazidostyrene, polyvinyl azidobenzalacetal, polyvinylazidonaphthylacetal, azidobenzaldehyde-phenolic resins, azide polymers of azidodiphenylamine and polycondensation product of formalin and vinyl alcohol, azide polymers of cellulose such as azidophthalate of partially hydrolyzed cellulose acetate, and azide polymers of gelatin and casein. Light-sensitive resins having a cinnamoyl group as a light-sensitive group include poly(vinyl cinnamate) and cinnamylideneacetate ester derivatives of PVA such as polyvinyl cinnamylideneacetate, polyvinyl ethoxycarbonylmethylcarbamate-cinnamylidene acetate, polyvinyl acetate-cinnamylidene acetate. Other examples are vinyl polymers such as poly(vinyl m-nitrocinnamate), polyvinyl-α-cyanocinnamate, polyvinyl-α-nitrocinnamate, polyvinyl-β-nitrocinnamate, polyvinyl-α-chlorocinnamate, polyvinyl-β-chlorocinnamate, polyvinyloxyethyl cinnamate, polyvinylthioethyl cinnamate, poly(2-cinnamoyloxyethylacrylate), poly(2-cinnamoyloxyethylmethacrylate), poly(vinylcinnamoyloxyacetate), poly(p-cinnamoyloxyvinyl benzene) and poly(p-cinnamoylstyrene); copolymers thereof with other polymers; oxirane ring-opened polymers such as polyglycidyl cinnamate and polyglycidyl cinnamylidene acetate; polymers prepared by reacting polymers having alkyl halide at side chains with carboxylic acid salts having sensitive groups in an aprotic polar solvent so as to introduce all or part of the sensitive groups, such as the polymers prepared by reacting polychloroethyl vinyl ether, polyvinyl chloroacetate, poly(ethyl β-chloroacrylate), polyepichlorphydrin and polyepibromohydrin with salts of cinnamic acid or their derivatives; and cation polymers of vinyl ethers such as polyvinyloxyethyl cinnamate.

Examples of the photopolymerizable resin having an ethylenically unsaturated double bond are described in U.S. Pat. No., and 3,060,026 with particular reference to the monomer and its polymerizable coupler. Suitable monomers are acrylic and methacrylic acid esters of polyvalent alcohols such as ethylene glycol, triethylene glycol, tetraethylene glycol, propylene glycol, trimethylolpropane, pentaerythritol and neopentyl glycol. Other examples are acrylate or methacrylate esters modified and derived from bisphenol A, such as the reaction products of acylic acid or methacrylic acid and bisphenol A-epichlorohydrin epoxy resin prepolymers, as well as acrylate or methacrylate esters of alkylene oxide adduct or hydrogenation product of bisphenol A. Methylene bisacrylamide, ethylene bisacrylamide, as well as bisacrylamides or bismethacrylamides of diamines such as ethylenediamine, propylenediamine, butylenediamine and pentamethylenediamine; the reaction products of diol monoacrylates or diol monomethacrylates and diisocyanates; and triacrylic formal or triallyl cyanate, may also be used.

Commercially available negative working type light-sensitive resins include KPR, KTFR and KMER of Eastman Kodak Company, U.S.A., Western Wipe-on of Western Litho Plate Co., U.S.A., Wipe-O-sensitizer of Litho Chemical & Supply Co., U.S.A., DCR (Dynachem Photo Resist) of Dynachem Corporation, WPR (Waycoat Photo Resist) of Philip A. Hunt Chemical Corporation, and Coping Lacquer-N of Kalle Aktingesellschaft. Domestic products are EPPR, OMR and TPR of Tokyo Ohka Kogyo Co., Ltd., Negakote Fuji Super Resist of Fuji Chemical Industries Co., Ltd., Wipedole Resist S of Okamoto Chemical Industries Co., Ltd. and KY Resist of Yamatoya Shoten.

Light-sensitive resins that form peelable layers are described in Japanese Patent Publications Nos. 9663/63, 15932/66, 22901/68, 43126/73, Japanese patent applications (OPI) Nos. 7728/72, 33623/72, 58909/73 an 101117/73; they are such light-sensitive polymers that the exposed or unexposed area completely or partially loses the adhesion to the underlying layer, i.e. the vapor-deposited metal layer or intermediate layer adjacent the support, or they are such light-sensitive monomers that upon illumination are polymerized to harden to have their adhesion to the underlying layer increased, decreased or lost entirely. Quite many compounds or compositions are available as these resins and suitable products can be selected depending on their characteristics.

According to the present invention, a subbing layer may be formed on the support. The subbing layer can be formed from a solution or dispersion of a suitable subbing resin by coating it on the support by means of a known coating method such as roller coating, air-knife coating, dip coating, curtain coating or spray coating.

For achieving rapid etching, the subbing layer is preferably soluble in or has affinity for an aqueous processing solution. In other words, the subbing layer is preferably made of materials that have solubility in or affinity for not only water but also aqueous alkaline or acidic solutions and other known aqueous processing solutions containing a small amount of organic solvent in these alkaline or acidic solutions. More specifically, the subbing layer is made of materials that provide a contact angle of 30 degrees or less when one minute has passed after drops of the aqueous processing solution are applied to the subbing layer, or it is made of materials that will swell in the aqueous processing solution. A subbing layer having such characteristics is preferably made by using one or more resins that are soluble in or have affinity for known aqueous processing solutions. Illustrative resins for use in development with water are water-soluble resins such as polyacrylic acid, polymethacrylic acid, polyvinyl alcohol, polyvinylpyrrolidone, gelatin, methyl cellulose, hydroxyethyl cellulose, hydroxypropyl methyl cellulose, carboxymethyl cellulose and polyethylene oxide. Resins for use in development with water or aqueous alkaline solutions include water-soluble or alkali-soluble resins such as novolak resins, vinylpyrrolidone copolymers, acrylic acid copolymers, methacrylic acid copolymers, acrylamide copolymers, methacrylamide copolymers, and maleic anhyride copolymers. resins for use in development with aqueous acidic solutions include dimethylaminomethyl methacrylate copolymers and diethylaminomethyl methacrylate copolymers having dialkylamino groups in side chains. To provide high resolution and edge sharpness, the subbing layer has a minimum thickness which is usually 2 microns or less, preferably 1 micron or less.

Figure 2A:
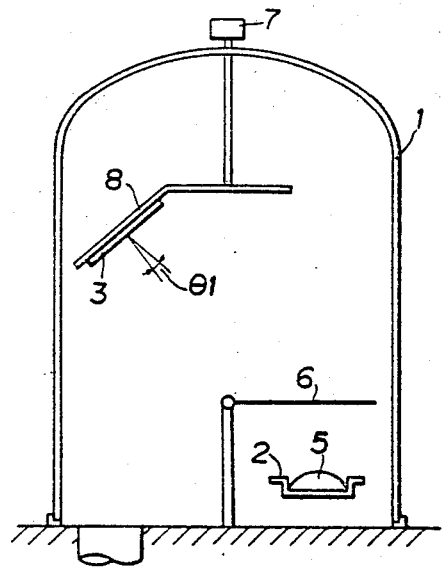
FIG. 2 is a schematic representation of an apparatus for producing a metal image forming material of the present invention according to another embodiment wherein a metal layer is vapor-deposited on the support by starting with an angle of $\theta_1$ (FIG. 2-A) and ending with an angle of $\theta_n$ (FIG. 2-B)
Figure 2B:
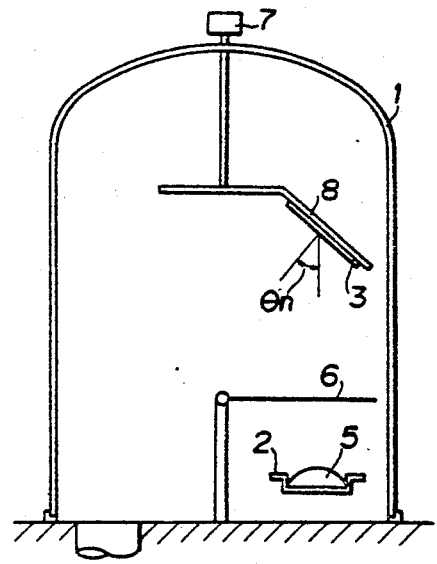

A modified apparatus of FIG. 1 is shown in FIGS. 2-A and 2-B wherein like parts are identified by like numerals. In FIG. 2-A, a vaporization vessel 2 faces a support 3 which is held at an initial deposition angle of $\theta_1$ ($<45°$) by a substrate holder 8 rotatable with a motor 7. When a predetermined deposition speed (flying velocity of vapor particles) is attained, a shutter 6 is opened and at the same time, the deposition angle is gradually changed by controlling the speed of motor 7 so as to provide the desired film thickness at the end of deposition (final deposition angle $\theta_n$ in FIG. 2-B). In other words, the deposition starts with the initial angle $\theta_1$ which is gradually increased to $\theta_n$ at which the deposition ends. The initial deposition angle is preferably less than 45 degrees and the final deposition angle is preferably at least 10 degrees larger than the initial one. The deposition rate and the rotating speed of motor 7 may vary with the nature of the film to be deposited.

Figure 3A:
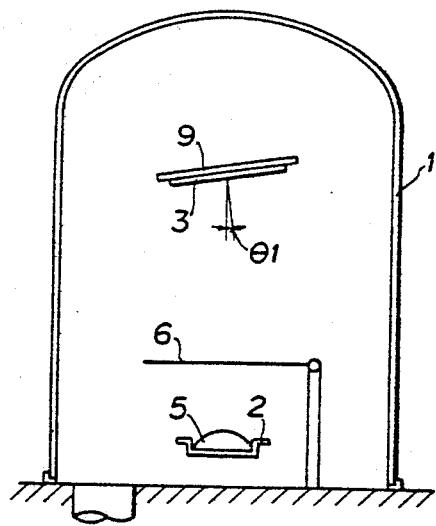
FIG. 3 is a schematic representation of an apparatus for producing the metal image forming material of the present invention according to a third embodiment wherein two metal layers are vapor-deposited on the support by using two different angles, $\theta_1$ (FIG. 3-A) and $\theta_2$ (FIG. 3-B).
Figure 3B:
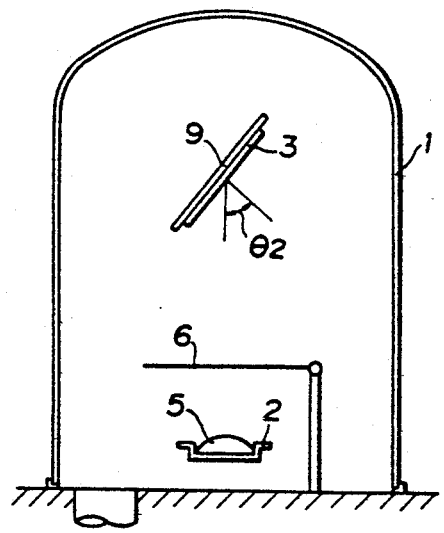

Another modification of the apparatus of FIG. 1 is shown in FIGS. 3-A and 3-B wherein like parts are identified by like numerals. In FIG. 3-A, a vaporization vessel 2 faces a support 3 which is held at an initial deposition angle of $\theta_1$ ($<45°$) by an adjustable substrate holder 9. When a predetermined film thickness has been attained, the deposition angle is adjusted to a value for the second stage deposition $\theta_2$ ($\geq 45°$) by a substrate adjuster (not shown), or alternatively, the substrate is taken out of the bell jar and replaced at the angle $\theta_2$ ($\geq 45°$) for effecting the second stage deposition. Two layers of different metals can be deposited by using two vaporization vessels put side by side. The vaporization vessel 2 is heated by suitable means such as resistance heating or heating with electron beams, to thereby cause the particles of vapor source 5 to fly toward the support 3. The deposition duration can be adjusted by opening and closing a shutter 6 interposed in the flying path. The deposition duration is properly determined by monitoring the film thickness or measuring the transmission density of the deposited film.

Various combinations of $\theta_1$ and $\theta_2$ are conceivable for forming two metal layers on the support, but preferably, $\theta_1$ (the initial deposition angle) is less than 45 degrees and $\theta_2$ the angle for the second stage deposition is 45 degrees or more. The layer formed by the initial deposition is hereunder referred to as the first layer, and that formed by the second stage deposition the second layer. If $\theta_1$ is 45 degrees or greater, side etching occurs easily to provide a blurred image edge, and if $\theta_2$ is less than 45 degrees, the desired etching speed is not obtained. The thickness of each metal layer depends on the optical density of the image to be obtained. Preferably the first layer has a thickness of up to 500 Å, and a thicker layer makes the desired etching speed unobtainable. The thickness of the second layer is set at the desired value after measuring the optical density of the final deposited film.

According to the present invention, the light-sensitive resin layer may be divided into two or more layers, or it may be provided with an intermediate layer, a protective layer or an antihalation layer. Three or more metal layers may also be formed, and in this case, the topmost layer is deposited at a larger angle than the underlying two or more layers wherein the deposition angle is decreased from top to bottom. For example, in a three-layer arrangement, the bottom layer is deposited at an angle of 0 degree, the intermediate layer at 30 degrees and the top layer at 80 degrees. As already mentioned, the metal layer or layers may be a mixture of the metal and a vapor-depositable organic material. The individual layers need not have a fixed deposition angle, and in a double-layer arrangement, the first and/or second layer may have an increasing deposition angle.

In the layer arrangement shown in FIGS. 2 and 3, the upper layer has been deposited at a greater angle than the lower layer, and the resulting metal layer has a more finely grained surface than the layer shown in FIG. 1. This helps not only to improve the adhesion of the light-sensitive resin layer to the metal layer but also to achieve quicker penetration of the etchant in the exposed area of the metal layer. This permits the use of a less powerful etchant without prolonging the etching period. The short etching period means less chance of attack on the resist and reduced side etching, so an image with sharp edge is produced for either fine line image or halftone image to accomplish precise photofabrication. As a further advantage, the top layer deposited at an angle greater than 45 degrees reduces the surface reflectance and provides effective protection against halation during exposure.

The present invention is now described in greater detail by reference to the following examples and comparative examples which are given here for illustrative purposes only and are by no means intended to limit the scope of the invention.

EXAMPLE 1

A roll of polyethylene terephthalate film support 100 microns thick was set on a substrate holder in a semicontinuous deposition apparatus. The holder was inclined to give a deposition angle ($\theta$) of 80 degrees. The apparatus was evacuated to $5 \times 10^{-5}$ Torr and the aluminum in a carbon crucible was heated to deposit the aluminum vapor on the support which was moving at a speed of 40 m/min. After confirming that the film had a transmission density of 3.5 on a Macbeth densitometer, the film was rewound into a roll pack. A coating solution of the formulation indicated below was applied to the aluminum layer by a whirler to give a dry thickness of 2.0 microns, and dried in an oven at 100° C. for 5 minutes:

Styrene/methacrylic acid (70/30) copolymer—5 g
    Pentaerythritol triacrylate—5 g
    Di-isopropyl thioxanthone—1 g
    Methyl cellosolve—100 ml The resulting sample of metal image forming material was set in a daylight Printer UP-6 of Ueno Kagaku K.K. where it was subjected to imagewise exposure to a 3 KW metal halide lamp for 20 seconds through a halftone original, and thereafter immersed in a 0.1N aqueous solution of sodium hydroxide (25° C.) for 30 seconds. The aluminum layer was completely removed from the unexposed area and a halation-free black image was produced wherein light and shadow in the aluminum layer in the exposed area having no metal gloss were substantially the reverse of what they were in the original. The individual dots had a sharp edge and the resulting image was accordingly sharp.

Comparative Example 1

A control sample was prepared by repeating the procedure of Example 1 except that the deposition angle was zero. The sample took 4 minutes to develop and the resulting image was comprised of dots with blurred edge. The aluminum layer had metallic gloss and caused halation that gave fat dots.

EXAMPLE 2

A sample was prepared by repeating the procedure of Example 1 except that the deposition angle was 60 degrees. By development at 25° C. for 40 seconds, the aluminum layer was completely removed from the unexposed area and a black image was produced wherein light and shadow in the aluminum layer in the exposed area with the intact resin were substantially the reverse of what they were in the original. The individual dots had a sharp edge.

EXAMPLE 3

The aluminum vapor was condensed on a polyethylene terephthalate film support as in Example 1. A layer of AZ-1350 (a positive working resist of Shipley Company, Inc.) was coated on the Al layer by a whirler to give a dry thickness of 1.5 microns, and dried in an oven at 100° C. for 5 minutes. The resulting sample of metal image forming material was set in a daylight Printer UP-6 where it was subjected to imagewise exposure through a halftone original, and thereafter developed with the standard developer for AZ-1350 to form a positive resist. The exposed sample was immersed in a 0.1N aqueous solution of sodium hydroxide at 25° C. for 30 seconds. The aluminum layer was completely removed from the resist-free area, and in the intact area, the aluminum layer had light and shadow which substantially corresponded to what they were in the original.

EXAMPLE 4

A roll of polyethylene terephthalate film support 100 microns thick which had a subbing layer of cresol-novolak resin 0.5 microns thick was set on a substrate holder in a semicontinuous deposition apparatus. The holder was inclined to give a deposition angle ($\theta$) of 80 degrees. The apparatus was evacuated to $5 \times 10^{-5}$ Torr and the aluminum in a carbon crucible was heated to deposit the aluminum vapor on the support which was moving at a speed of 40 m/min. After confirming that the film had a transmission density of 3.5 on a Macbeth densitometer, the film was rewound into a roll pack. A coating solution of the formulation indicated below was applied to the aluminum layer by a whirler to give a dry thickness of 2.0 microns, and dried in an oven at 100° C. for 5 minutes:

Styrene/methacrylic acid (70/30) copolymer—5 g
    Pentaerythritol triacrylate—5 g
    Diisopropyl thioxanthone—1 g
    Methyl cellosolve—100 ml The resulting sample of metal image forming material was set in a daylight Printer UP-6 of Ueno Kagaku K.K. where it was subjected to imagewise exposure to a 3 kW metal halide lamp for 20 seconds through a halftone original, and thereafter immersed in a 0.1N aqueous solution of sodium hydroxide (25° C.) for 30 seconds. The aluminum layer was completely removed from the unexposed area and a halation-free black image was produced wherein light and shadow in the aluminum layer in the exposed area having no metal gloss were substantially the reverse of what they were in the original. The individual dots had a sharp edge and the resulting image was accordingly sharp.

Comparative Example 2

A control sample was prepared by repeating the procedure of Example 4 except that the deposition angle was zero. The sample took 4 minutes to develop and the resulting image was comprised of dots with blurred edge. The aluminum layer had metallic gloss and caused halation that gave fat dots.

EXAMPLE 5

The aluminum vapor was condensed on a polyethylene terephthalate film support 100 microns thick as in Example 4 except that the support had a subbing layer 0.3 microns thick made of a styrene/sodium maleate copolymer (molar ratio=1:1). A coating solution of the formulation indicated below was applied to the aluminum layer by a whirler to give a dry thickness of 2.0 microns, and dried in an oven at 100° C. for 5 minutes:

Polyvinyl acetate (long-chain acrylate copolymer emulsion, (Gelva TS-100, of Monsanto Corp.)—100 ml
    Diazo resin (Fairmount #4)—4 g The resulting sample of metal image forming material was set in a daylight Printer UP-6 where it was subjected to exposure through a halftone original for 20 seconds, and developed under flushing water by rubbing with sponge, whereupon the aluminum layer was completely removed from the unexposed area and a black image was obtained wherein light and shadow in the aluminum layer in the exposed area were substantially the reverse of what they were in the original.

EXAMPLE 6

A roll of polyethylene terephthalate film support 100 microns thick was set in a semicontinuous deposition apparatus. The apparatus was evacuated to $5 \times 10^{-5}$ Torr and the aluminum in a carbon crucible was heated to condense the aluminum vapor on the support which was moving at a speed of 40 m/min in such a manner that the deposition angle varied continuously from 0 to 80 degrees. After confirming that the film had a transmission density of 3.5 on a Macbeth densitometer, the film was rewound into a roll pack. A coating solution of the formulation indicated below was applied to the aluminum layer by a whirler to give a dry thickness of 2.0 microns, and dried in an oven at 100° C. for 5 minutes:

Styrene/methacrylic acid (70/30) copolymer—5 g
Pentaerythritol triacrylate—5 g
Diisopropyl thioxanthone—1 g
Methyl cellosolve—100 ml The resulting sample of metal image forming material was set in a daylight Printer UP-6 of Ueno Kagaku K.K. where it was subjected to imagewise exposure to a 3 kW metal halide lamp for 20 seconds through a halftone original, and thereafter immersed in a 0.1N aqueous solution of sodium hydroxide (25° C.) for 30 seconds. The aluminum layer was completely removed from the unexposed area and a halation-free image which was black on the sensitive layer side and had metallic gloss on the support side was obtained wherein light and shadow in the aluminum layer in the exposed area were substantially the reverse of what they were in the original. The individual dots had a sharp edge and the resulting image was accordingly sharp.

Comparative Example 3

A control sample was prepared by repeating the procedure of Example 6 except that the deposition angle remained zero throughout the deposition. The sample took 4 minutes to develop and the resulting image was comprised of dots with blurred edge. The aluminum layer had metallic gloss and caused halation that gave fat dots.

EXAMPLE 7

The aluminum vapor was condensed on a polyethylene terephthalate film support as in Example 6 except that the deposition angle was varied from 40 to 80 degrees. A layer of AZ-1350 was coated on the Al layer by a whirler to give a dry thickness of 1.5 microns, and dried in an oven at 100° C. for 5 minutes. The resulting sample of metal image forming material was set in a daylight Printer UP-6 where it was subjected to imagewise exposure for 45 seconds through a halftone original, and thereafter developed with the standard developer for AZ-1350 to form a positive resist. The exposed sample was immersed in a 0.1N aqueous solution of sodium hydroxide at 25° C. for 20 seconds. The aluminum layer was completely removed from the resist-free area, and in the intact area, the aluminum layer had light and shadow areas which substantially corresponded to what they were in the original.

EXAMPLE 8

A roll of polyethylene terephthalate film support 100 microns thick was set in a semicontinuous deposition apparatus in such a manner that the initial deposition angle ($\theta_1$) was 0 degree whereas the angle for the second deposition ($\theta_2$) was 80 degrees. The apparatus was evacuated to $5 \times 10^{-5}$ Torr and the aluminum on two different points in a carbon crucible was heated to condense the aluminum vapor on the support which was moving at a speed of 40 m/min. In the initial stage of deposition ($\theta_1 = 0°$), the thickness of the first layer was monitored to be at 50 Å, and thereafter, the second layer was formed. After confirming that the overall film had a transmission density of 3.5 on a Macbeth densitometer, the film was rewound into a roll pack. A coating solution of the formulation indicated below was applied to the aluminum layer by a whirler to give a dry thickness of 2.0 microns, and dried in an oven at 100° C. for 5 minutes:

Styrene/methacrylic acid (70/30) copolymer—5 g
Pentaerythritol triacrylate—5 g
Diisopropyl thioxanthone—1 g
Methyl cellosolve—100 ml The resulting sample of metal image forming material was set in a daylight Printer UP-6 of Ueno Kagaku K.K. where it was subjected to imagewise exposure to a 3 kW metal halide lamp for 20 seconds through a halftone original, and thereafter immersed in a 0.1N aqueous solution of sodium hydroxide (25° C.) for 30 seconds. The aluminum layers were completely removed from the unexposed area and a halation-free image which was black on the sensitive layer side and had metallic gloss on the support side was obtained wherein light and shadow in the aluminum layers in the exposed area were substantially the reverse of what they were in the original. The individual dots had a sharp edge and the resulting image was accordingly sharp.

Comparative Example 4

A control sample was prepared by repeating the procedure of Example 8 except that only one cycle of deposition was effected at an angle of 0 degree. The sample took 4 minutes to develop and the resulting image was comprised of dots with blurred edge. The aluminum layer had metallic gloss and caused halation that gave fat dots.

EXAMPLE 9

The aluminum vapor was deposited in two layers on a polyethylene terephthalate film support as in Example 8 except that $\theta_1$ was 40 degrees to provide the first layer 50 Å thick and $\theta_2$ was 80 degrees. A layer of AZ-1350 was coated on the Al layer by a whirler to give a dry thickness of 1.5 microns, and dried in an oven at 100° C. for 5 minutes. The resulting sample of metal image forming material was set in a daylight Printer UP-6 where it was subjected to imagewise exposure for 45 seconds through a halftone original, and thereafter developed with the standard developer for AZ-1350 to form a positive resist. The exposed sample was immersed in a 0.1N aqueous solution of sodium hydroxide at 25° C. for 30 seconds. The aluminum layers were completely removed from the resist-free area, and in the intact area, the aluminum layers had light and shadow areas which substantially corresponded to what they were in the original.

EXAMPLE 10

A roll of polyethylene terephthalate film support 100 microns thick was set in a semicontinuous deposition apparatus in such a manner that the initial deposition angle for aluminum ($\theta_1$) was 40 degrees and the angle for the second stage deposition of iron ($\theta_2$) was 80 degrees. The apparatus was evacuated to $5 \times 10^{-5}$ Torr and the aluminum and iron on two different points in a carbon crucible were heated in the order of deposition and their vapors were condensed on the support which was moving at a speed of 40 m/min. In the initial stage of deposition ($\theta_1 = 40°$), the thickness of the aluminum layer was monitored to be 500 Å, and thereafter, the second iron layer was formed. After confirming that the overall film had a transmission density of 3.5 on a Macbeth densitometer, the film was rewound into a roll pack. A light-sensitive resin layer was formed on the iron layer as in Example 8, and by exposure and development, an image was obtained wherein light and shadow areas were substantially the reverse of what they were in the original.

What is claimed is:

1. A metal image forming material comprising in sequence
   (a) a support,
   (b) a subbing layer on said support,
   (c) at least one metal layer on said subbing layer, and
   (d) a light-sensitive resin layer provided on the metal layer furthest from said support, wherein said subbing layer is soluble in or has an affinity for an aqueous processing solution, said metal layer being prepared by vapor deposition of a metal and said metal layer furthest from said support being deposited by a vapor directed at said support at an angle of at least 45° to a line normal to said support.

2. A metal image forming material according to claim 1 wherein said subbing layer is made of material that provides a contact angle of 30 degrees or less.

3. A metal image forming material according to claim 1 wherein said metal layer is formed essentially of aluminum.

4. A metal image forming material according to claim 1 wherein said light-sensitive resin layer is a positive working type light-sensitive resin layer.

5. A metal image forming material according to claim 4 wherein said positive working type light-sensitive resin layer is formed essentially of a quinondiazide compound.

6. A metal image forming material according to claim 1 wherein said light-sensitive resin layer is a negative working type light-sensitive resin layer.

7. A metal image forming material according to claim 6 wherein said negative working type light-sensitive resin layer is formed essentially of a photopolymerizable component.

8. A metal image forming material according to claim 1 wherein the total thickness of a deposited metal layer or layers is from 100 Å to 3000 Å.

9. A metal image forming material according to claim 1 wherein said subbing layer is made of material that will swell in an aqueous processing solution.

10. A metal image forming material according to claim 1, in which two layers are deposited on said support, and in which the first layer is deposited at an angle of more than 30° but less than 45° and the uppermost layer is deposited at an angle greater than or equal to the deposition angle of said first layer.

11. A metal image forming material according to claim 1, in which said angle is about 45°.

12. A metal image forming material comprising in sequence
    (a) a support,
    (b) at least two metal layers on said support, and
    (c) a light-sensitive resin layer provided on the metal layer furthest from said support,
wherein said metal layers are prepared by vapor deposition, said metal layer furthest from said support being deposited by a vapor directed at said support at an angle of at least 45° to a line normal to said support, the other metal layers being deposited at an angle relative to the normal of said support which is less than the angle of deposition of said metal layer furthest from said support.

13. A metal image forming material according to claim 12 wherein said metal layer furthest from said support is formed essentially of aluminum.

14. A metal image forming material according to claim 12 wherein said light-sensitive resin layer is a positive working type light-sensitive resin layer.

15. A metal image forming material according to claim 14 wherein said positive working type light-sensitive resin layer is formed essentially of a quinone diazide compound.

16. A metal image forming material according to claim 12 wherein said light-sensitive resin layer is a negative working type light-sensitive resin layer.

17. A metal image forming material according to claim 16 wherein said negative working type light-sensitive resin layer is formed essentially of a photopolymerizable component.

18. A metal image forming material according to claim 12 wherein the total thickness of a deposited metal layer or layers is from 100 Å to 3000 Å.

19. A metal image forming material comprising a support, a metal layer formed thereon by the deposition of the vapor of a metal deposited thereon at an angle, said angle being greater than 30° but less than 45° from the normal to the support during the initial deposition, and increasing at least 10° at final deposition to an angle of greater than 45°, and a light-sensitive resin layer covering said deposited metal layer.

20. A metal image forming material according to claim 19 wherein said metal layer is formed essentially of aluminum.

21. A metal image forming material according to claim 20 wherein said light-sensitive resin layer is a positive working type light-sensitive resin layer.

22. A metal image forming material according to claim 21 wherein said positive working type light-sensitive resin layer is formed essentially of a quinone diazide compound.

23. A metal image forming material according to claim 19 wherein said light-sensitive resin layer is a negative working type light-sensitive resin layer.

24. A metal image forming material according to claim 23 wherein said negative working type light-sensitive resin layer is formed essentially of a photopolymerizable component.

25. A metal image forming material according to claim 19 wherein the total thickness of a deposited metal layer or layers is from 100 Å to 3000 Å.

26. A method for the production of a metal image forming material comprising the steps of forming at least one metal layer on a support by depositing the vapor of a metal thereon at an angle of at least 45° from a line normal to said support and applying a light-sensitive resin layer over said metal layer.

27. A method according to claim 26 further comprising the step of applying a subbing layer between the support and the metal layer, said subbing layer being soluble in or having affinity for an aqueous processing solution.

28. A method according to claim 26 wherein said deposition is proceeded with at an increasing angle with respect to the normal to the support.

29. A method according to claim 26 wherein said metal image forming material comprises two metal layers, the upper layer being deposited at an angle larger than the lower layer.

30. A method according to claim 26, wherein said deposition is conducted by any means of vacuum-depositing, sputtering or ion plating.

* * * * *